(12) United States Patent
Close et al.

(10) Patent No.: US 9,076,517 B2
(45) Date of Patent: Jul. 7, 2015

(54) MEMORY APPARATUS WITH GATED PHASE-CHANGE MEMORY CELLS

(71) Applicant: International Business Machines Corporation, Armonk, NY (US)

(72) Inventors: Gael Close, Rueschlikon (CH); Daniel Krebs, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/927,778

(22) Filed: Jun. 26, 2013

(65) Prior Publication Data

US 2013/0322168 A1 Dec. 5, 2013

Related U.S. Application Data

(63) Continuation of application No. 13/900,224, filed on May 22, 2013.

(30) Foreign Application Priority Data

May 31, 2012 (GB) .................................. 1209652.5

(51) Int. Cl.
*G11C 13/00* (2006.01)
*G11C 11/56* (2006.01)
*G11C 16/04* (2006.01)

(52) U.S. Cl.
CPC ........ *G11C 13/0004* (2013.01); *G11C 13/0009* (2013.01); *G11C 11/5678* (2013.01); *G11C 13/003* (2013.01); *G11C 16/0483* (2013.01); *G11C 2213/53* (2013.01); *G11C 2213/75* (2013.01); *G11C 2211/5613* (2013.01); *G11C 2211/5611* (2013.01)

(58) Field of Classification Search
CPC ....................................................... G11C 13/00
USPC .......................................... 365/163; 428/64.4
See application file for complete search history.

(56) References Cited

U.S. PATENT DOCUMENTS

| 7,269,080 | B2 | 9/2007 | Bedeschi et al. |
| 7,656,710 | B1 | 2/2010 | Wong |
| 7,885,101 | B2 | 2/2011 | Bedeschi et al. |
| 8,085,583 | B2 * | 12/2011 | Suh ................................ 365/163 |
| 8,130,538 | B2 | 3/2012 | McElheny et al. |

(Continued)

OTHER PUBLICATIONS

"Prototype of Phase-Change Channel Transistor for both Nonvolatile Memory and Current Control", Hosaka et al., IEEE Transactions on Electron Devices, 2007, 54, 517-523.*
Cai et al., "Multi-Bit Storage Based on Chalcogenide Thin Film Transistor for High Density Nonvolatile Memory Application", Integrated Ferroelectrics, 110: 2009, pp. 34-42.

(Continued)

*Primary Examiner* — Amir Zarabian
*Assistant Examiner* — Muna Techane
(74) *Attorney, Agent, or Firm* — Cantor Colburn LLP

(57) ABSTRACT

A memory apparatus includes a plurality of gated phase-change memory cells having $s \geq 2$ programmable cell-states, the cells each having a gate and being arranged in series between a source and drain; a bias voltage generator configured to apply a bias voltage to the gate of each cell; and a controller configured to control the bias voltage generator, in a write operation for programming the state of a cell, to apply a first bias voltage to the gate of each cell except an addressed cell for the write operation, wherein application of the first bias voltage to a cell reduces the cell resistance such that application of a programming signal between the source and drain effects programming of the addressed cell only.

11 Claims, 6 Drawing Sheets

(56) References Cited

U.S. PATENT DOCUMENTS

| | | |
|---|---|---|
| 8,301,977 B2 * | 10/2012 | Jagasivmani et al. ......... 714/763 |
| 2006/0145135 A1 | 7/2006 | Huang et al. |
| 2007/0132049 A1 * | 6/2007 | Stipe ............................. 257/421 |
| 2007/0248785 A1 * | 10/2007 | Nakai et al. .................. 428/64.4 |
| 2008/0149913 A1 | 6/2008 | Tanaka et al. |
| 2009/0059651 A1 | 3/2009 | Aoki |
| 2009/0073741 A1 | 3/2009 | Liu |
| 2009/0080242 A1 | 3/2009 | Resta et al. |
| 2009/0296457 A1 | 12/2009 | Suh |
| 2010/0020593 A1 | 1/2010 | Suh |
| 2010/0165712 A1 * | 7/2010 | Bedeschi et al. .............. 365/163 |
| 2011/0069538 A1 | 3/2011 | Lam et al. |
| 2012/0051170 A1 | 3/2012 | Yoon et al. |
| 2012/0092941 A1 | 4/2012 | Porter |
| 2013/0040584 A1 | 2/2013 | Bedeschi |

OTHER PUBLICATIONS

Hosaka et al., "Prototype of Phase-Change Channel Transistor for Both Nonvolatile Memory and Current Control", IEEE Transactions on Electron Devices, vol. 54, No. 3, Mar. 2007, 15 pages.

Liao, et al., "Characterization of Ge2Sb2Te5 thin film transistor and its application in non-volatile memory", Microelectronics Journal 37 (2006); www.elsevier.com/locate/mejo; pp. 841-844.

UK Intellectual Property Office, Application No. GB1209652.5; Patents Act 1977: Search Report Under Section 17(5); Mailed Sep. 26, 2012, pp. 1-3.

UK Intellectual Property Office, Application No. GB1209653.3; Patents Act 1977: Search Report Under Section 17(5); Mailed Sep. 26, 2012, pp. 1-4.

Gong Yue-Feng, et al., "Programming Voltage Reduction in Phase Change Cells with Conventional Structure," IEEE, 2011, pp. 1-3.

\* cited by examiner

MEMORY APPARATUS WITH GATED PHASE-CHANGE MEMORY CELLS

PRIORITY

This application is a continuation of U.S. patent application Ser. No. 13/900,224, filed May 22, 2013, which claims priority to Great Britain Patent Application No. 1209652.5, filed May 31, 2012, and all the benefits accruing therefrom under 35 U.S.C. §119, the contents of which in its entirety are herein incorporated by reference.

BACKGROUND

This invention relates generally to memory apparatus using gated phase-change memory cells for information storage.

Phase change memory (PCM) is a non-volatile solid-state memory technology that exploits the reversible, thermally-assisted switching of certain chalcogenide compounds, such as GST, between states with different electrical resistance. The fundamental storage unit (the "cell") can be programmed to any one of $s \geq 2$ different states, or levels, which exhibit different resistance characteristics. The s programmable cell-states can be used to represent different data values, whereby data can be recorded in the cells. In single-level PCM devices, the cell can be set to one of $s=2$ states, a crystalline state and an amorphous "RESET" state. In the RESET state, the electrical resistance of the cell is high. When heated to a temperature above its crystallization point and then cooled, the chalcogenide material is transformed into its low-resistance crystalline state. If the cell is then heated to a high temperature, above the chalcogenide melting point, the chalcogenide material reverts to the amorphous RESET state on rapid cooling. In multilevel PCM devices, the cell can be set to $s>2$ different states permitting storage of more than one bit per cell. As well as the two states used for SLC operation, multilevel cells exploit partially-crystalline states in which the cell contains different volumes of the amorphous phase within the crystalline PCM material. Varying the size of the amorphous region produces a corresponding variation in cell resistance. The partially-crystalline states thus provide additional programmable states, with intervening resistance values, between the wholly-crystalline low-resistance state and the high-resistance RESET state.

To write data in PCM devices, cells are programmed to different cell-states by the application of current or voltage signals. Joule heating due to the programming signal heats the chalcogenide material to an appropriate temperature to induce the desired cell-state on cooling. Reading of PCM cells is performed using cell resistance as a metric for cell-state. Read measurements are usually performed by biasing the cell with a fixed read voltage and measuring the resulting current flowing through the cell. A sufficiently low read voltage is used for this resistance metric to ensure that application of the read voltage does not disturb the programmed cell-state. Cell-state detection can be performed by comparing the resistance metric for each cell with predetermined reference levels defining the s programmable cell-states. The larger the resistance difference between the lowest and highest resistance states, the more robust the read-detection process. Hence the amorphous RESET state must have a very high resistance while the fully-crystalline state should have a very low resistance. However, programming via Joule heating requires a large current to pass through the cell. In particular, since power dissipation for a given current decreases with cell resistance, a particularly large cell current is needed to reset a cell from a low-resistance crystalline state to the amorphous RESET state.

Conventional PCM cells are two-terminal devices consisting of a layer of chalcogenide material between a pair of electrodes. To form an integrated memory array, cells arranged in rows and columns are connected in parallel between pairs of word- and bit-lines. An access device, typically an FET (field-effect transistor) whose gate is connected to the word-line, is connected in series with the PCM cell which is connected in turn to the cell bit-line. A particular cell is accessed for read/write operations by applying a word-line voltage to the gate of the associated FET. The programming/read signal is then applied via the cell bit-line.

More recently, gated PCM cells have been proposed. These cells have three terminals, a gate, source and drain, with the PCM material forming a channel between the source and drain. The basic structure of a gated PCM cell is illustrated in FIG. 1 of the accompanying drawings. The cell 1 in this example has chromium source and drain electrodes 2, 3 and a silicon gate electrode 4. A layer of phase-change material provides the channel 5 between the source 2 and drain 3. A gate oxide layer 6 of silicon dioxide lies between the gate 4 and PCM channel 5. Various other materials and layers may be employed in the gated cell structure. In any case, by application of suitable programming signals between the source 2 and drain 3, the PCM material of channel 5 can be caused to switch between amorphous and crystalline states as described earlier, permitting storage of information in the cell. Gated PCM cells are discussed, for example, in: "Prototype of Phase-Change Channel Transistor for both Nonvolatile Memory and Current Control", Hosaka et al., IEEE Transactions on Electron Devices, 2007, 54, 517-523; and "Multi-bit Storage based on Chalcogenide Thin Film Transistor for High Density Nonvolatile Memory Application", Yanfei Cai et al., Integrated Ferroelectrics, 110: 34-42, 2009.

SUMMARY

In one embodiment, a memory apparatus includes a plurality of gated phase-change memory cells having $s \geq 2$ programmable cell-states, the cells each having a gate and being arranged in series between a source and drain; a bias voltage generator configured to apply a bias voltage to the gate of each cell; and a controller configured to control the bias voltage generator, in a write operation for programming the state of a cell, to apply a first bias voltage to the gate of each cell except an addressed cell for the write operation, wherein application of the first bias voltage to a cell reduces the cell resistance such that application of a programming signal between the source and drain effects programming of the addressed cell only.

In another embodiment, a method of operating a memory apparatus having a plurality of gated phase-change memory cells having $s \geq 2$ programmable cell-states, the cells each having a gate and being arranged in series between a source and drain, includes applying, using a bias voltage generator, a bias voltage to the gate of each cell; and using a controller, configured to control the bias voltage generator, in a write operation for programming the state of a cell, to apply a first bias voltage to the gate of each cell except an addressed cell for the write operation, wherein application of the first bias voltage to a cell reduces the cell resistance such that application of a programming signal between the source and drain effects programming of the addressed cell only.

BRIEF DESCRIPTION OF THE SEVERAL VIEWS OF THE DRAWINGS

Exemplary embodiments of the invention will now be described, by way of example, with reference to the accompanying drawings in which.

DETAILED DESCRIPTION

Figure 1:
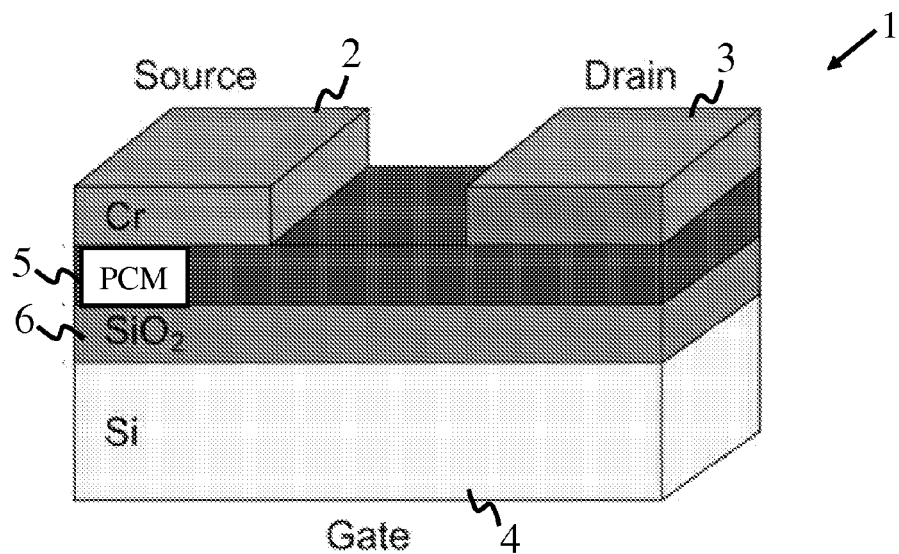
FIG. 1 illustrates structure of a prior gated PCM cell.

An embodiment of a first aspect of the present invention provides memory apparatus comprising a plurality of gated phase-change memory cells having s≥2 programmable cell-states, the cells each having a gate and being arranged in series between a source and drain; a bias voltage generator for applying a bias voltage to the gate of each cell; and a controller adapted to control the bias voltage generator, in a write operation for programming the state of a cell, to apply a first bias voltage to the gate of each cell except an addressed cell for the write operation, wherein application of the first bias voltage to a cell reduces the cell resistance such that application of a programming signal between the source and drain effects programming of the addressed cell only.

Memory apparatus embodying this invention employs a plurality of gated PCM cells, each having a respective gate, which are arranged in series between a source and drain. A bias voltage can be applied to the gate of each cell by a bias voltage generator, and bias voltage control is used to select an addressed cell for a write operation by deselecting the others. In particular, to address a cell for a write operation, a first bias voltage is applied to the gate of each cell in the series except the addressed cell. Application of the first bias voltage to a cell reduces cell resistance sufficiently that the programming signal, applied between the source and drain for the write operation, cannot change the state of that cell. The first bias voltage thus effectively deactivates cells to deselect those cells for the write operation. In this way, only the addressed cell is programmed on application of the programming signal. The series arrangement of gated cells between common source and drain terminals can be used to build dense arrays of memory cells in which individual cells can still be addressed via the bias voltage control mechanism. Embodiments of the invention thus offer highly efficient memory devices.

The same voltage control mechanism can be used to address cells for read operations. In particular, the controller can be adapted to control the bias voltage generator, in a read operation for reading the state of a cell, to apply the first bias voltage to the gate of each cell except an addressed cell for the read operation, whereby application of a read signal between the source and drain permits reading of the addressed cell by making a read measurement between the source and drain. Again, application of the first bias voltage reduces cell resistance sufficiently to deactivate a cell, whereby non-addressed cells are deactivated and the addressed cell can be read on application of the read signal by making a read measurement between the source and drain. The usual low-voltage read signal can be used here, with read measurement of the resulting cell current as discussed earlier. To permit cell-state detection based on the conventional resistance metric in preferred embodiments, zero bias voltage is applied to the gate of the addressed cell in a read operation.

As described earlier, the s≥2 programmable cell-states of PCM cells include an amorphous RESET state and at least one crystalline state (which may be a wholly-crystalline state or a partially crystalline state containing a certain proportion of amorphous material). Preferred embodiments of the invention employ a technique for controlling resistance of addressed cells on programming cell-state. This technique forms the subject of our copending UK patent application, filed concurrently herewith under Applicant's file reference CH9-2012-0040-GB1, the relevant content of which is incorporated herein by reference. In particular, in preferred embodiments the controller is further adapted to control the bias voltage generator, in a write operation for programming an addressed cell from a crystalline state to the RESET state, to apply a second bias voltage to the gate of the addressed cell to increase the cell resistance. This improves current efficiency for the reset operation because power dissipation in the cell will be higher for a given current and hence a given programming signal, providing an effective RESET current reduction. As this effect is controlled by the gate voltage, power efficiency can be improved without reducing the resistance contrast between the amorphous and fully-crystalline states since the low-field resistance of the crystalline cell at zero gate bias is not affected. This technique thus offers increased power efficiency without affecting readback performance.

When programming the addressed cell to the RESET state, the cell-resistance can be tuned by adjusting the second bias voltage. While any increase in resistance will improve power efficiency, the gate voltage level is preferably selected to provide optimum results. In particular, the second bias voltage can set to increase the cell resistance to a value at or near a predetermined maximum value for the crystalline state. For example, the voltage level may be selected to give a cell resistance within a desired window of the maximum achievable by varying the gate bias.

While the second bias voltage could be applied to any addressed cell to be reset to the amorphous state, for optimum power efficiency on programming it is preferable to apply the second bias voltage on reset only when programming from a crystalline state, and not when the cell is already programmed to the RESET state. For this reason, in preferred embodiments the controller is adapted to control reading of a memory cell to obtain an indication of cell-state before programming that cell, and to control the bias voltage generator such that, on programming a cell to the RESET state, the second bias voltage is applied to that cell only if a crystalline cell-state is indicated on reading of the cell. Such "read-before-write" functionality is commonly employed in any case, e.g. in known iterative WAV (write-and-verify) type programming.

An embodiment of another aspect provides memory for use in memory apparatus according to the first aspect of the invention. The memory comprises a plurality of gated phase-change memory cells having s≥2 programmable cell-states, the cells each having a gate and being arranged in series between a source and drain.

Figure 2:
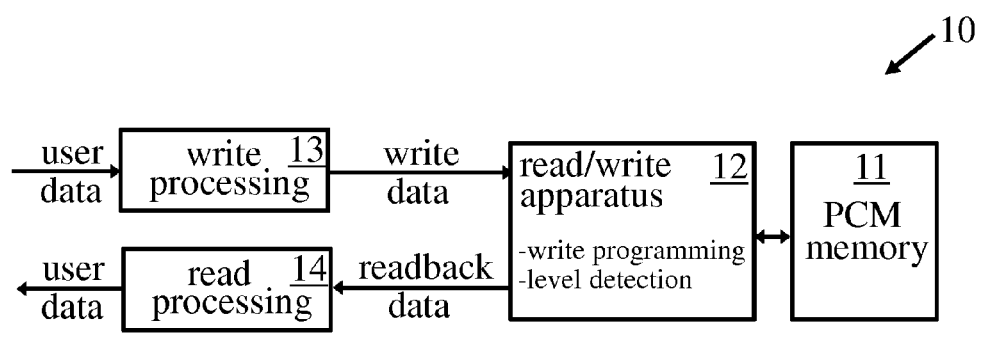
FIG. 2 is a schematic block diagram of a memory device embodying the invention.

FIG. 2 is a simplified schematic of a phase-change memory device embodying the invention. The device 10 includes phase-change memory 11 for storing data in gated PCM cells described in more detail below. Reading and writing of data to memory 11 is performed by read/write apparatus 12. Apparatus 12 comprises circuitry for programming PCM cells during data write operations and for making read measurements for detecting cell-state (level detection) during read operations. The read/write apparatus 12 can address individual PCM cells for read/write operations using a technique detailed below. As indicated by block 13 in the figure, user data input to device 10 is typically subjected to some form of write-processing, such as coding for error-correction purposes, before being supplied as write data to apparatus 12. Similarly, readback data output by apparatus 12 is generally processed by a read-processing module 14, e.g. for codeword detection and error correction, to recover the original input user data.

Figure 3:
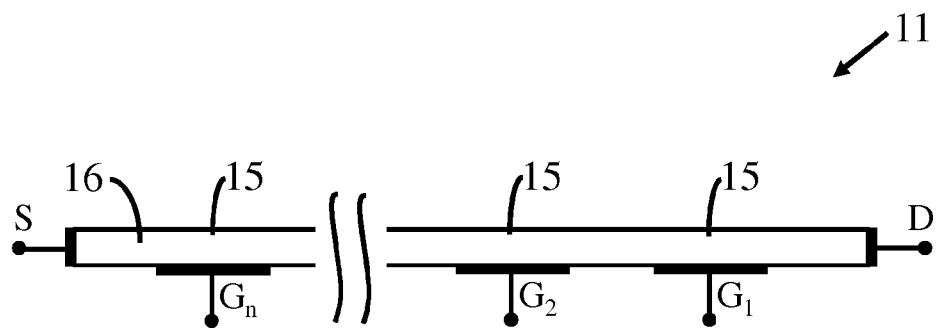
FIG. 3 is a schematic illustration of memory employed in the FIG. 2 device.
Figure 4:
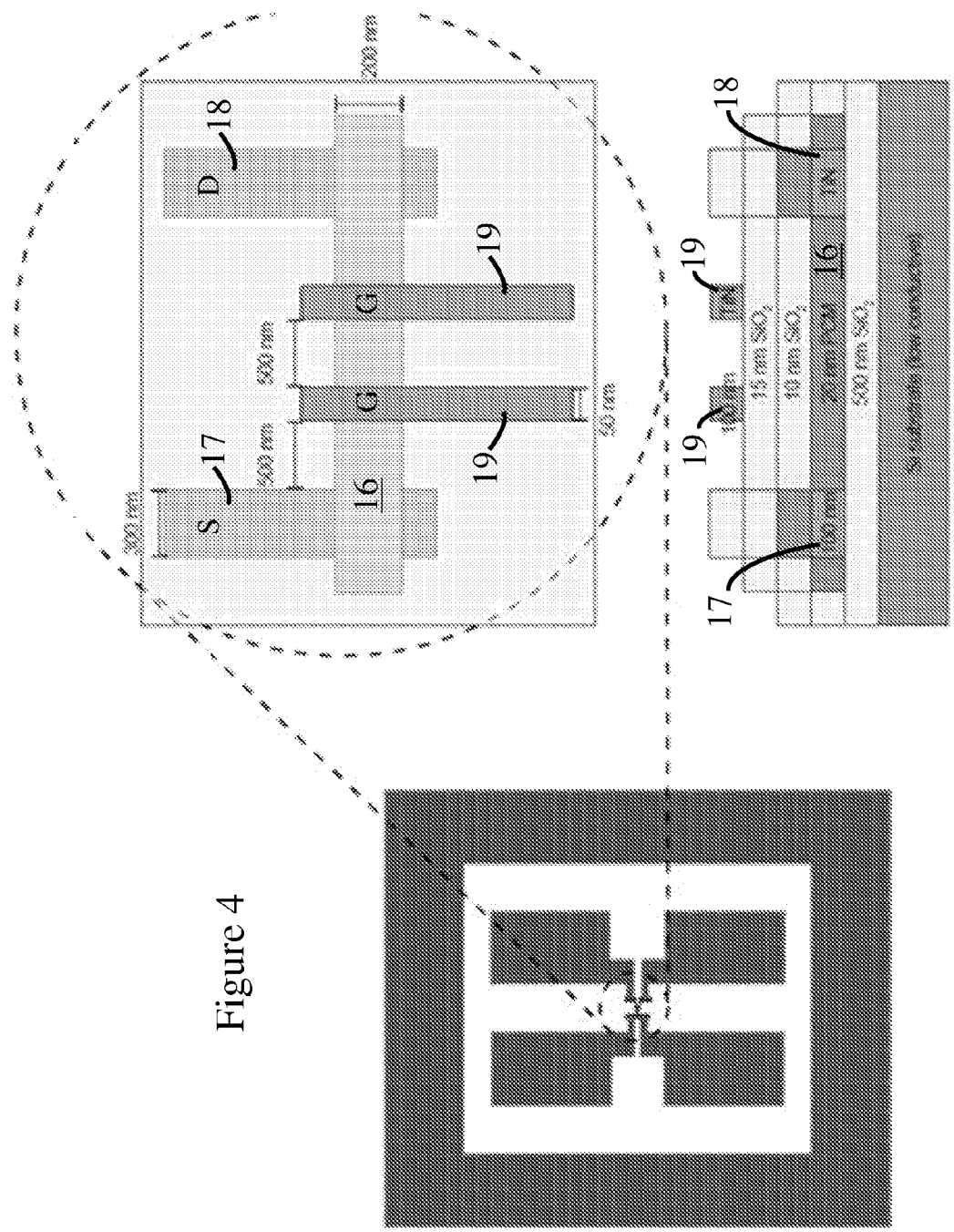
FIG. 4 illustrates an exemplary structure for the memory of FIG. 3.

FIG. 3 is a schematic illustration of the arrangement of PCM cells in memory 11. The cells 15 are formed by gated regions of a PCM channel 16 extending between a source S and drain D which are common to all cells. The cells, each of which has its own gate $G_1$, $G_2$, ... $G_n$ as indicated, are thus arranged in series between a single source and a single drain. FIG. 4 is a schematic illustration of an exemplary structure for the memory 11. The structure is illustrated in simplified form here for an arrangement of two series-connected PCM cells 15, but the structure indicated can be readily extended to the multiple cells of a memory array. The structure is based on a bridge cell arrangement as shown in elevation on the left of the figure and in the enlargement in the upper right portion of the figure. The lower right portion of the figure shows the enlarged structure in cross-section. As indicated, a PCM channel 16 extends between a source 17 and drain 18, with two gate electrodes 19 being spaced along the channel. Examples of potential materials and dimensions are indicated purely by way of illustration in the figure, and proportions are not shown to scale for simplicity. Numerous other materials, structures and dimensions may be employed for constructing the series-connected cell arrangement as will be apparent to those skilled in the art.

A write operation in memory device 1 involves programming a PCM cell 1 into one of its s programmable cell-states. A read operation involves detecting which of these s states, or levels, the cell is set to. The read/write apparatus 12 for performing these functions is described in more detail below. For simplicity, operation will be described for PCM cells 15 having s=2 programmable states, an amorphous RESET state, which has high resistance and is used to represent binary "0", and a low-resistance crystalline state which is used to represent binary "1".

Figure 5:
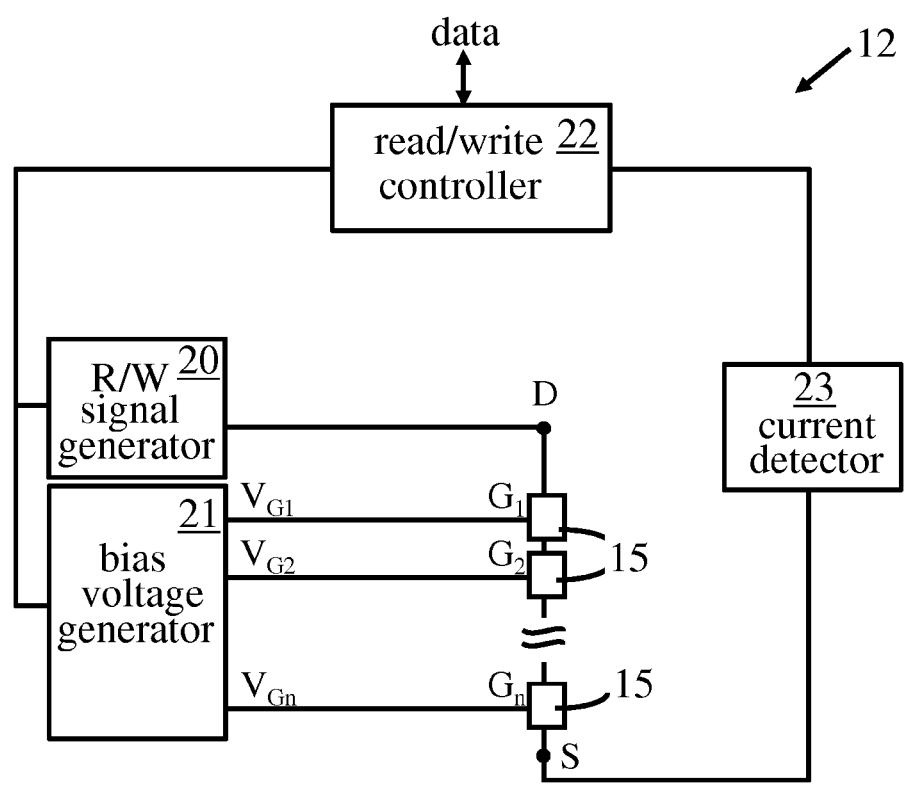
FIG. 5 is a schematic block diagram of read/write apparatus of the FIG. 2 memory device.

FIG. 5 is a block diagram showing the main components of read/write apparatus 12. The apparatus 12 includes a signal generator 20, a bias voltage generator 21, a read/write controller 22, and a read measurement circuit implemented here by current detector 23. Signal generator 20 is connected to the drain D of the series of PCM cells 15. The source S of the cell-series is connected to current detector 23. Bias voltage generator 21 is connected to the gates $G_1$ to $G_n$ of the cells 15 for applying respective gate bias voltages $V_{G1}$ to $V_{Gn}$ as described in detail below. Signal generator 20 generates the programming and read signals which are applied to cells 15 via the drain terminal D to perform read/write operations on the cell. In particular, in a write operation, a programming signal is applied between the source and drain of the cell-series 11 by application of an appropriate voltage pulse at the drain D. The height of the programming pulse can be set so as to program an addressed cell to the desired cell-state. In a read operation, a read signal is similarly applied to the cell-series by application of a low-voltage read pulse at the drain D. The current detector 23 measures the resulting current flowing through the cell-series in a read operation. The measured cell-current $I_{read}$ is supplied to controller 22. Controller 22 controls operation of apparatus 12 generally, incorporating functionality for implementing the addressing and programming methods to be described and for performing level detection based on read measurements $I_{read}$. Signal generator 20, voltage generator 21 and current detector 23 can be implemented in any desired manner, preferably using hard-wired logic circuits, so as to perform the functions described. The functionality of controller 22 could be implemented in general in hardware or software or a combination thereof. Suitable implementations will be apparent to those skilled in the art from the description herein.

Figure 6:
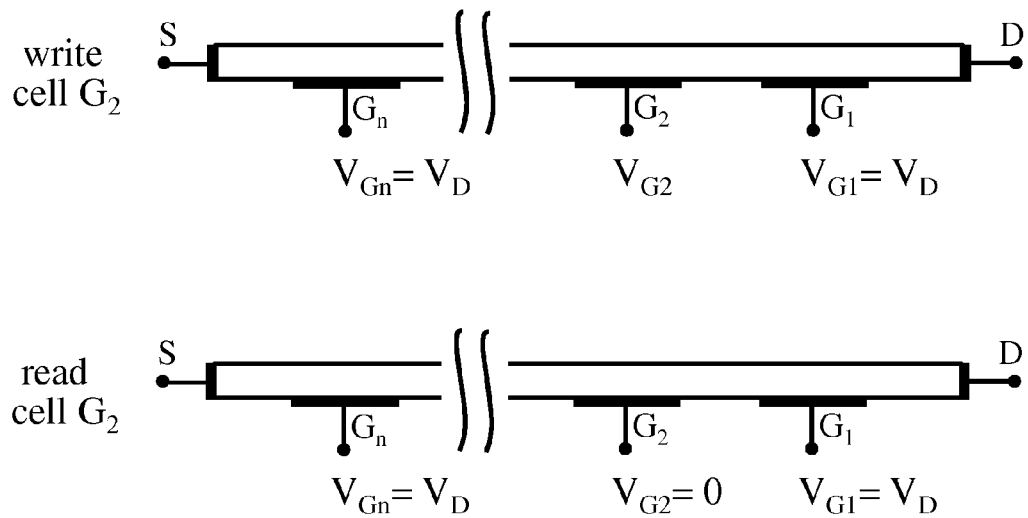
FIG. 6 illustrates addressing of a PCM cell for read and write operations.

During read/write operations, addressing of particular cells 15 in the cell-series is performed via the bias voltages $V_{G1}$ to $V_{Gn}$ generated by bias voltage generator 21. The addressing system is illustrated schematically in FIG. 6 where the upper diagram indicates bias voltages for a write operation and the lower diagram indicates bias voltages for a read operation. To address a particular cell, here the cell with gate $G_2$, for a write operation, controller 22 controls the bias voltage generator to apply a first bias voltage $V_D$ to the gate of each cell in the series except the addressed cell. The voltage $V_D$ is effectively a de-activation voltage. The effect of this gate voltage on a cell 15 is to reduce cell resistance to such an extent that the programming pulse applied to the drain D for the write operation cannot change the state of that cell. The way in which the polarity and level of voltage $V_D$ are selected for this purpose will be explained in detail below. Application of the bias voltage $V_D$ thus effectively deactivates cells to deselect those cells for the write operation. In this way, only the addressed cell $G_2$ will be programmed on application of the programming signal. In some embodiments, the bias voltage, here $V_{G2}$, of the addressed cell could be set to zero for the write operation. In other embodiments $V_{G2}$ could be set using a technique described below for controlling resistance of addressed cells on programming.

A similar bias voltage control system is used to address cells for read operations. As indicated in the lower diagram of FIG. 6, to read cell $G_2$, the controller 22 controls the bias voltage generator to apply the deactivation voltage $V_D$ to the gate of each cell except the addressed cell. Again, application of the gate voltage $V_D$ reduces cell resistance sufficiently to deactivate a cell for the read operation. Zero bias voltage is applied to the gate of the addressed cell for the read operation, i.e. $V_{G2}=0$ here. Thus, on application of the read voltage at drain D, the resulting current in the cell series is dependent on the resistance, and hence cell-state, of the addressed cell. The read measurement $I_{read}$ made by current detector 23 thus provides a cell-state metric from which the state of the addressed cell can be determined in controller 22.

It will be seen that, with the above system, only two terminals (i.e. source and drain) are required for read/write operations on cells 15 with access control via the gates providing a deselection system permitting reading or writing of individual cells. Using this system, memory 11 can be implemented as a high-density stack of memory cells with two electrodes for fast switching and individual electrodes for gating. Moreover, preferred embodiments employ a technique described in our aforementioned UK patent application for improving power efficiency on programming. This technique is described below.

To program cell 15 in a data write operation, the apparatus 12 functions as follows. Read/write controller 22 first controls the apparatus to perform a read measurement on the cell. Hence, bias voltage generator 21 addresses the desired cell via the mechanism described above, and signal generator 20 applies the read voltage at drain D. The resulting current measurement $I_{read}$ supplied by current detector 23 to controller 22 provides a direct indication of the state of the cell as described above. The subsequent write operation depends on the result of this preliminary read measurement, and the state to which the cell is to be programmed, as follows.

If the cell is to be programmed to the amorphous RESET state, then operation differs depending on whether the preliminary read measurement indicates that the current cell-state is amorphous or crystalline. Assuming first that the current cell-state is amorphous, the programming operation is performed, under control of read/write controller 22, with zero bias voltage applied to the gate G of the addressed cell by bias voltage generator 21. Hence, the appropriate programming voltage is applied by signal generator 20 at the drain D so as to program the cell to the required RESET state. (Note that, although the preliminary read measurement already indicated an amorphous cell-state in this scenario, resistance levels of programmed states can drift with time so that this "re-programming" of the RESET state may be desirable to restore resistance levels. Reprogramming may also be required for particular coding schemes which require whole blocks of cells to be written, and hence over-written, at certain times).

Assuming next that a crystalline cell-state was indicated by the preliminary read operation, then the cell must be reset from the crystalline to the amorphous state. In this case, under control of read/write controller 22, the signal generator applies the appropriate reset programming voltage to the drain D, and a second bias voltage $V_R$ is applied to the gate G of the addressed cell by bias voltage generator 21. The effect of this bias voltage $V_R$ is to increase the resistance of the addressed cell compared to the cell-resistance at zero gate bias. More particularly, the bias voltage level is set so as to increase the cell resistance to within a desired window of a predetermined maximum resistance value for the crystalline state. The way in which the bias voltage polarity and level is selected here will be explained in detail below. The more resistive crystalline on-state obtained by application of the gate voltage $V_R$ results in increased power dissipation in the cell due to the applied programming signal. Thus, the required RESET current, and hence programming voltage for the reset operation, can be reduced, with a consequent improvement in power efficiency.

If the cell is to be programmed to the crystalline state in the write operation, then operation is independent of the preliminary read measurement. Controller 22 controls signal generator 21 such that the appropriate programming signal is applied to the drain D. In this particular embodiment, zero gate bias applied to the gate of the addressed cell for this programming operation. An alternative embodiment will be described below.

With the above programming system, when programming a cell 15 in memory device 10, the bias voltage generator 21 applies a gate bias, increasing cell resistance, only when programming the addressed cell from the crystalline state to the amorphous RESET state. Zero gate bias is applied for the read operation on a cell which is performed in the same way for data readback and read-before-write operation on programming. This leads to highly efficient operation, with significant power saving due to the effective RESET current reduction. Moreover, the low-voltage resistance of the ungated cell is unaffected by this technique, whereby the large resistance contrast between crystalline and amorphous states is maintained for readback purposes.

Figures 7A, 7B:
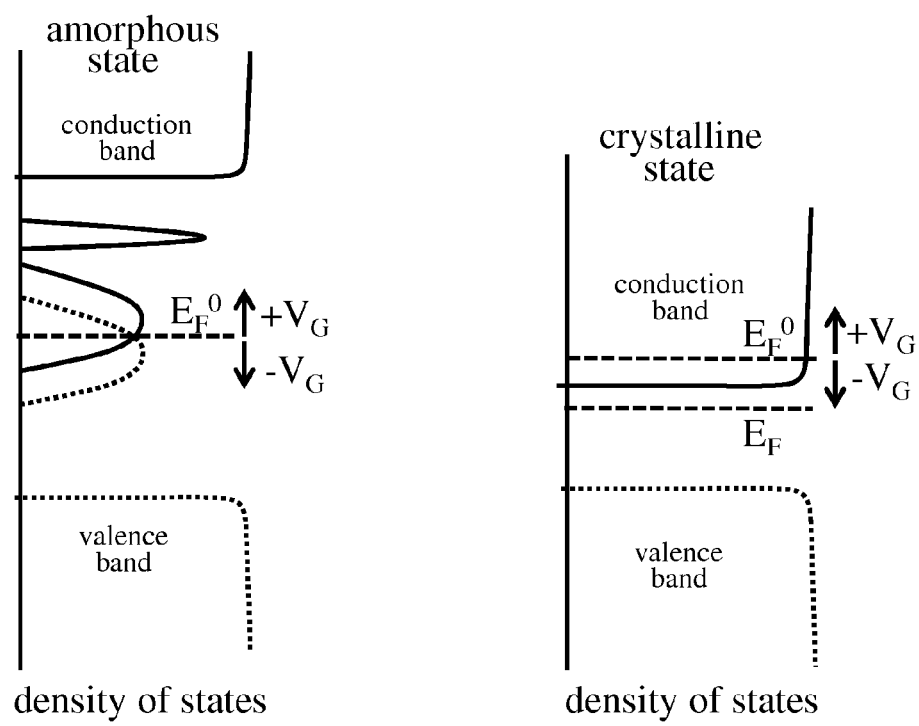
FIGS. 7A and 7B are energy band diagrams for amorphous and crystalline states of a PCM cell.

The appropriate polarity and optimum level of the gate voltages $V_D$ and $V_R$ depends on the design of the PCM cell. In particular, the optimum voltage in each case depends on its effect on the Fermi level of the PCM material in question. This can be understood from consideration of FIGS. 7A to 9B. FIGS. 7A and 7B are schematic energy band diagrams for an exemplary PCM material in the amorphous state (FIG. 7A) and the crystalline state (FIG. 7B). The conduction band is shown at the top, and the valence band at the bottom, of these figures. Some arbitrary energy states are indicated in the band gap for the amorphous state, where the dotted line corresponds to hole-states and the solid lines to electron-states. In the amorphous state for this PCM cell, the Fermi level $E_F^0$ at zero gate bias is approximately mid-way between the conduction and valence bands, indicating a high cell resistance. Application of a positive gate voltage $+V_G$ moves the Fermi level up towards the conduction band, and application of a negative gate voltage $-V_G$ moves the Fermi level down towards the valence band. As the Fermi level approaches the conduction or valence band, conductivity increases due to induced electrons or holes respectively, resulting in decreased cell resistance. In the crystalline state at zero gate bias, the Fermi level $E_F^0$ is in the conduction band, indicating a high conductivity due to electrons and hence a low cell resistance. If a negative gate bias voltage $-V_G$ is applied in this state, the Fermi level is moved towards the valence band due to induced holes, resulting in increased cell resistance. As $V_G$ is increased in magnitude with negative polarity, the Fermi level can be moved out of the conduction band as indicated at $E_F$.

Figure 8B:
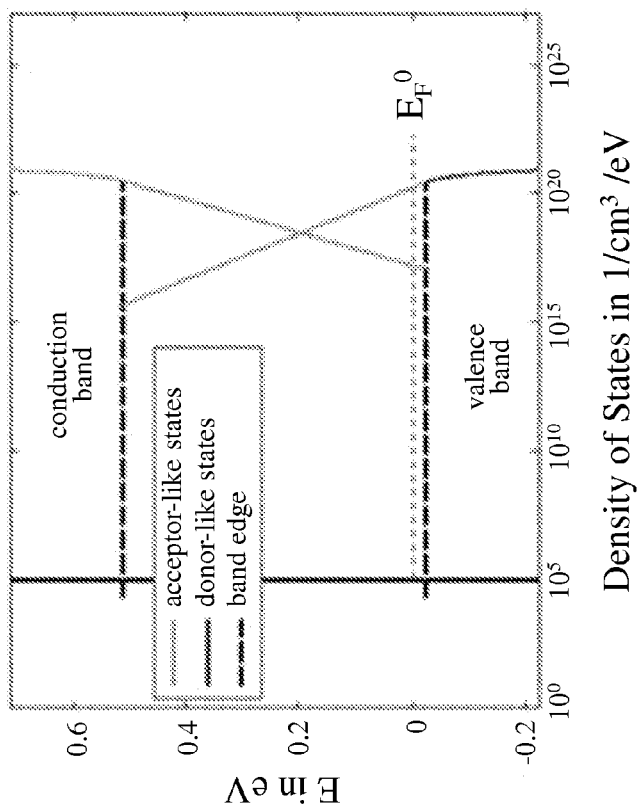
FIGS. 8A and 8B show energy band diagrams for amorphous and crystalline states of a different PCM cell.
Figure 8A:
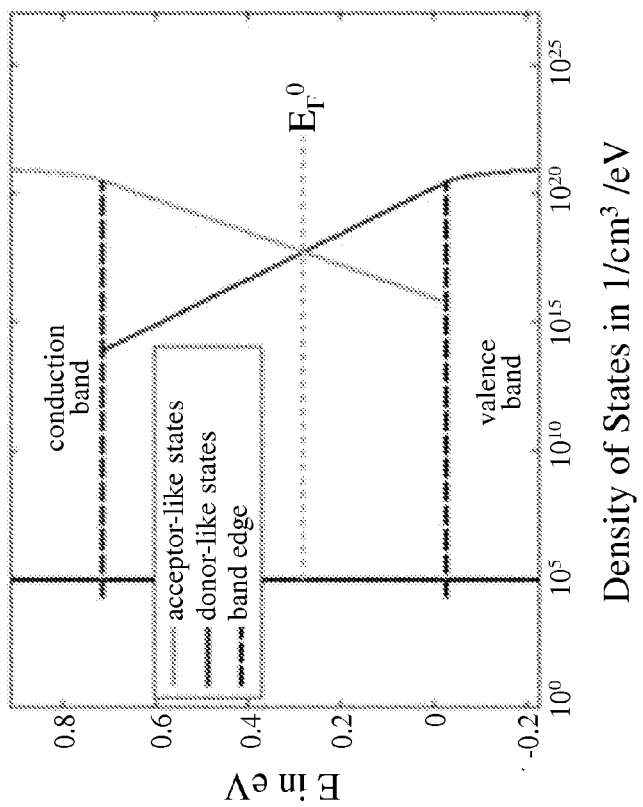

FIGS. 8A and 8B illustrate more realistic energy band diagrams based on simulations for a cell with different PCM material. The band edges are indicated by dashed lines in these figures, with each band having a tail portion in the band gap due to either acceptor-like states or donor-like states as indicated. Again, for the amorphous cell-state the Fermi level $E_F^0$ at zero gate bias is roughly midway between the conduction and valence bands. In this example, however, the Fermi level $E_F^0$ the crystalline state at zero gate bias lies just above the valence band. Hence, application of a positive gate voltage in this state will cause the Fermi level to move up towards the conduction band due to induced electrons, resulting in decreased conductivity due to holes and an overall increase in cell resistance.

Figure 9B:
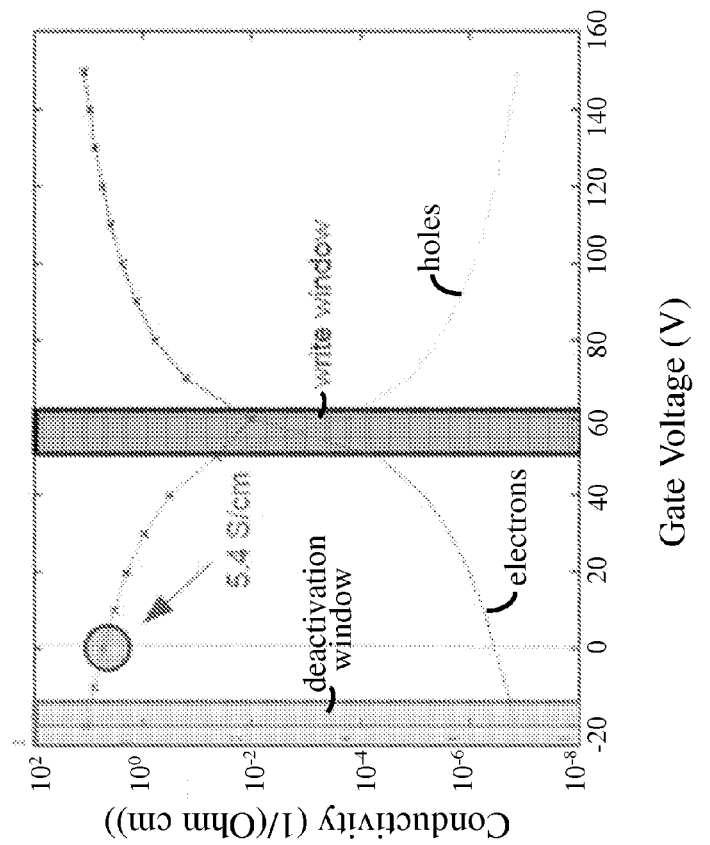
FIGS. 9A and 9B indicate variation of conductivity with gate voltage for the cell-states of FIGS. 8A and 8B.
Figure 9A:
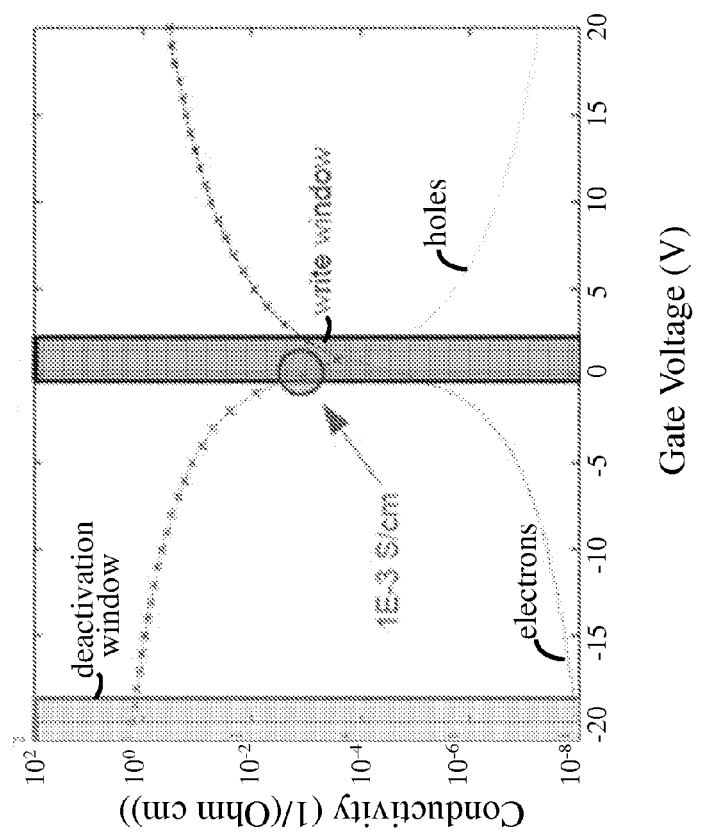

The overall effect of gate voltage $V_G$ on conductivity for the two states of FIGS. 8A and 8B is illustrated in FIGS. 9A and 9B respectively. In each figure, the trace which rises with gate voltage indicates conductivity due to electrons, and the trace which falls with gate voltage indicates conductivity due to holes. The sections marked with crosses indicate the dominant charge carrier. The point at which the hole and electron traces cross in each figure indicates the minimum overall conductivity, and hence maximum resistance, achievable by varying gate voltage in the corresponding cell-state. The vertical band labeled "write window" thus defines a range of gate voltages giving a cell resistance at or near the maximum for each state. In each figure, the circle marks the conductivity of the associated cell-state at zero gate bias. Note that, in the amorphous state, the zero-bias conductivity (1E-3 siemens/cm) is already within the write window, indicating a cell resistance close to the maximum. In the crystalline state, however, conductivity at zero gate bias is high and primarily due to holes because of proximity of the Fermi level to the valence band as shown in FIG. 8b. The zero-bias conductivity (5.4 siemens/cm) in this state is therefore well outside the write window, resulting in a cell resistance much lower than the maximum. It can be seen, however, that if a positive gate voltage $V_R$ of about 50-60V is applied in this state, the conductivity can be moved into the write window in FIG. 9B, giving a cell resistance at or near the maximum as desired. (Note that the value of $V_R$ here results from the particular materials and geometry used in the simulation. This value can be lowered by optimizing the gate stack as will be readily apparent to those skilled in the art).

It will be appreciated from the above that the resistance of the crystalline state can effectively be tuned by the gate bias. In general, if the Fermi level for the cell in the crystalline state is in or near the conduction band, the polarity of $V_R$ can be set to move the Fermi level towards the valence band. If the Fermi level in the crystalline state is in or near the valence band, the polarity of $V_R$ can be set to move the Fermi level towards the conduction band. By selecting a voltage $V_R$ within the write window as described above, an optimum resistance and hence reset current can be achieved for programming a given cell type to the RESET state. In effect, therefore, the gate of the PCM cell is used here to tune the reset current to improve power efficiency on programming.

It is also apparent from FIGS. 9A and 9B that cells in both states can be deactivated by applying a gate voltage $V_D$ which maximizes conductivity and hence minimizes resistance. In both states, a gate voltage of $V_D=-20V$ lies within the vertical band labeled "deactivation window" which corresponds to cell resistance at or near the minimum for each state.

While an exemplary embodiment has been described above, many changes and modifications can of course be envisaged. For example, while operation has been described for cells having s=2 programmable states for simplicity, the technique can be readily applied to multilevel cells. The s>2 programmable cell-states for multilevel operation may be defined in terms of predetermined reference values, or ranges of values, of the cell-state metric $I_{read}$ output by the read measurement operation. In a data read operation, the programmed state of a cell can be detected by comparing the metric $I_{read}$ obtained from read measurement with the predetermined reference values for the cell levels. A gate voltage $V_R$ can then be applied to increase resistance of an addressed cell when programming from any (wholly or partially) crystalline state to the amorphous RESET state. Multilevel programming may be performed in generally known manner via an iterative WAV operation using a sequence of programming pulses. Here, read measurement is performed after each pulse in the sequence, and the amplitude of the next pulse can be adjusted based on the metric output by the read measurement, until the desired programmed cell-state is achieved.

In the embodiment described above, zero bias voltage is applied to the gate of an addressed cell when programming to a crystalline state. In this case, a desired (wholly or partially) crystalline cell-state can be achieved by varying the programming pulse output by signal generator 20 in order to vary the resulting cell current. In other embodiments, the cell current for programming different states could be varied by varying the gate voltage $V_G$ to an addressed cell. In this case, signal generator 20 could apply the same programming pulse for programming any crystalline state, and the desired cell-state can be achieved on application of the programming signal by applying a particular bias voltage for that state to the gate of the addressed cell. The bias voltage for a given state may be predetermined for that state or may be determined based on a previous read measurement, e.g. during iterative programming as described above.

In general, the PCM memory in embodiments of the invention may comprise a single set of series-connected cells 15 or a plurality of such sets of cells, with read/write operation for each set being performed as described above.

Voltage-mode programming and read operation is employed above whereby the programming/read signal is applied between the source and drain as a predetermined voltage, and the resulting current is measured for a read operation. Current-mode programming/read operation may alternatively be used, whereby a predetermined current pulse is applied for programming/read operations and the resulting voltage between the source and drain is detected for the read measurement.

It will be appreciated that many other changes and modifications can be made to the embodiments described without departing from the scope of the invention.

The invention claimed is:
1. A memory apparatus, comprising:
a plurality of gated phase-change memory cells having s≥2 programmable cell-states, the cells each having a gate and being arranged in series between a source and drain;
a bias voltage generator configured to apply a bias voltage to the gate of each cell;
a controller configured to control the bias voltage generator, in a write operation for programming the state of a cell, to apply a first bias voltage to the gate of each cell except a first addressed cell for the write operation, wherein application of the first bias voltage to a cell reduces the cell resistance such that application of a programming signal between the source and drain effects programming only of the addressed cell;
wherein the s programmable cell-states include an amorphous RESET state and at least one crystalline state, and further comprising, in the write operation for programming the first addressed cell, reading of the first addressed cell to obtain an indication of cell-state before programming the first addressed cell, and controlling the bias voltage generator by applying a second bias voltage to the gate of the first addressed cell to increase the cell resistance only when programming the first addressed cell from the crystalline state to the RESET state, as determined by indicating the crystalline state from the reading of the first addressed cell, wherein the second bias voltage is not applied when reprogramming the cell from an indicated RESET state to the RESET state.

2. The apparatus of claim 1, wherein the controller is configured to control the bias voltage generator, in a read operation for reading the state of a cell, to apply the first bias voltage to the gate of each cell except a second addressed cell for the read operation, wherein application of a read signal between the source and drain permits reading of the second addressed cell by making a read measurement between the source and drain.

3. The apparatus of claim 2, wherein in a read operation, zero bias voltage is applied to the gate of the second addressed cell.

4. The apparatus of claim 1, wherein the second bias voltage is set to increase the cell resistance to a value at or near a predetermined maximum value for the crystalline state.

5. The apparatus of claim 1, wherein the phase change material is selected such that the Fermi level for the cell in a crystalline state is in or near the conduction band, and wherein the second bias voltage polarity is set at a negative value to move the Fermi level down towards the valence band on applying the second bias voltage.

6. The apparatus of claim 1, wherein the phase change material is selected such that the Fermi level for the cell in a crystalline state is in or near the valence band, and wherein the second bias voltage polarity is set at a positive value to move the Fermi level up towards the conduction band on applying the second bias voltage.

7. The apparatus of claim 1, wherein the controller is adapted to control the bias voltage generator such that, when programming a cell to a crystalline state, zero bias voltage is applied to the gate of that cell.

8. The apparatus of claim 1, wherein the controller is adapted to control the bias voltage generator such that, when programming a cell to the crystalline state, a bias voltage for that state is applied to the gate of the cell to program that state on application of the programming signal.

9. The apparatus of claim 1, further comprising:
- a signal generator configured to apply a programming signal between the source and drain for programming an addressed cell and for applying a read signal between the source and drain in a read operation for an addressed cell; and
- a measurement circuit configured to perform a read measurement between the source and drain on application of the read signal to obtain an indication of cell-state for the addressed cell.

10. The apparatus of claim 1, wherein s=2.

11. The apparatus of claim 1, wherein s>2.

* * * * *